(12) United States Patent
Logunov et al.

(10) Patent No.: US 10,011,525 B2
(45) Date of Patent: Jul. 3, 2018

(54) GLASS SEALING WITH TRANSPARENT MATERIALS HAVING TRANSIENT ABSORPTION PROPERTIES

(71) Applicant: CORNING INCORPORATED, Corning, NY (US)

(72) Inventors: Stephan Lvovich Logunov, Corning, NY (US); Mark Alejandro Quesada, Horseheads, NY (US)

(73) Assignee: Corning Incorporated, Corning, NY (US)

(*) Notice: Subject to any disclaimer, the term of this patent is extended or adjusted under 35 U.S.C. 154(b) by 0 days.

(21) Appl. No.: 15/584,559

(22) Filed: May 2, 2017

(65) Prior Publication Data

US 2017/0233289 A1 Aug. 17, 2017

Related U.S. Application Data

(62) Division of application No. 13/841,391, filed on Mar. 15, 2013, now Pat. No. 9,666,763.

(60) Provisional application No. 61/731,784, filed on Nov. 30, 2012.

(51) Int. Cl.
| | |
|---|---|
| *C03C 27/06* | (2006.01) |
| *B29C 65/16* | (2006.01) |
| *H01L 21/02* | (2006.01) |
| *H01S 5/02* | (2006.01) |
| *C03C 4/08* | (2006.01) |
| *C08K 3/02* | (2006.01) |

(52) U.S. Cl.
CPC .......... *C03C 27/06* (2013.01); *B29C 65/1635* (2013.01); *C03C 4/085* (2013.01); *C08K 2003/023* (2013.01); *H01L 21/02348* (2013.01); *H01S 5/0216* (2013.01)

(58) Field of Classification Search
CPC ................. H01L 31/048; H01L 33/483; H01L 21/02348; B29C 65/1635; B29C 65/1638; C03C 4/085; C03C 3/247; C03C 27/06; B03C 8/24; H01S 5/0216
See application file for complete search history.

(56) References Cited

U.S. PATENT DOCUMENTS

| | | | |
|---|---|---|---|
| 5,089,446 | A | 2/1992 | Cornelius et al. |
| 5,272,309 | A | 12/1993 | Goruganthu et al. |
| 5,489,321 | A | 2/1996 | Tracy et al. |
| 6,423,613 | B1 | 7/2002 | Geusic |
| 6,501,043 | B1 | 12/2002 | Ruben |

(Continued)

FOREIGN PATENT DOCUMENTS

| | | |
|---|---|---|
| EP | 1117502 B1 | 1/2003 |
| JP | 2006524417 A | 10/2006 |

(Continued)

*Primary Examiner* — Cheung Lee
*Assistant Examiner* — Stephen C Smith
(74) *Attorney, Agent, or Firm* — Ryan T. Hardee

(57) ABSTRACT

Transparent glass-to-glass hermetic seals are formed by providing a low melting temperature sealing glass along a sealing interface between two glass substrates and irradiating the interface with laser radiation. Absorption by the sealing glass and induced transient absorption by the glass substrates along the sealing interface causes localized heating and melting of both the sealing glass layer and the substrate materials, which results in the formation of a glass-to-glass weld. Due to the transient absorption by the substrate material, the sealed region is transparent upon cooling.

20 Claims, 8 Drawing Sheets

(56) References Cited

U.S. PATENT DOCUMENTS

| | | |
|---|---|---|
| 6,501,044 B1 | 12/2002 | Klockhaus et al. |
| 6,555,025 B1 | 4/2003 | Krupetsky et al. |
| 6,717,100 B2 | 4/2004 | Ruben |
| 6,762,072 B2 | 7/2004 | Lutz |
| 6,818,530 B2 | 11/2004 | Shimoda et al. |
| 7,344,901 B2 | 3/2008 | Hawtof et al. |
| 7,361,573 B2 | 4/2008 | Takayama et al. |
| 7,449,773 B2 | 11/2008 | Tarn |
| 7,615,506 B2 | 11/2009 | Aitken et al. |
| 7,626,138 B2 | 12/2009 | Bovatsek et al. |
| 7,722,929 B2 | 5/2010 | Aitken et al. |
| 7,829,147 B2 | 11/2010 | Aitken et al. |
| 7,872,338 B2 | 1/2011 | Tarn |
| 8,134,293 B2 | 3/2012 | Logunov et al. |
| 8,148,179 B2 | 4/2012 | Aitken et al. |
| 8,314,359 B2 | 11/2012 | Bovatsek et al. |
| 8,343,412 B2 | 1/2013 | Klein et al. |
| 8,367,440 B2 | 2/2013 | Takayama et al. |
| 8,375,744 B2 | 2/2013 | Becken et al. |
| 8,389,891 B2 | 3/2013 | Bovatsek et al. |
| 8,490,434 B2 | 7/2013 | Watanabe et al. |
| 8,530,786 B2 | 9/2013 | Bovatsek et al. |
| 8,563,113 B2 | 10/2013 | Ewards et al. |
| 8,697,242 B2 | 4/2014 | Kawanami et al. |
| 8,778,121 B2 | 7/2014 | Tuennermann et al. |
| 8,778,469 B2 | 7/2014 | Kawanami et al. |
| 8,796,109 B2 | 8/2014 | Ruben et al. |
| 8,975,159 B2 | 3/2015 | Akiyama |
| 9,021,836 B2 | 5/2015 | Matsumoto |
| 9,093,668 B2 | 7/2015 | Han |
| 9,120,287 B2 | 9/2015 | Ruben et al. |
| 9,171,721 B2 | 10/2015 | Danzl et al. |
| 2001/0027633 A1 | 10/2001 | Amako et al. |
| 2004/0082145 A1 | 4/2004 | Reichenbach et al. |
| 2004/0256367 A1 | 12/2004 | Ruben |
| 2005/0116245 A1 | 6/2005 | Aitken et al. |
| 2005/0151151 A1 | 7/2005 | Hawtof et al. |
| 2005/0199599 A1 | 9/2005 | Li et al. |
| 2006/0172875 A1 | 8/2006 | Cortright et al. |
| 2007/0040501 A1 | 2/2007 | Aitken et al. |
| 2009/0308105 A1 | 12/2009 | Pastel et al. |
| 2010/0047587 A1 | 2/2010 | Itoh et al. |
| 2010/0190051 A1 | 7/2010 | Aitken et al. |
| 2011/0209813 A1 | 9/2011 | Shibuya et al. |
| 2012/0028011 A1 | 2/2012 | An et al. |
| 2012/0147538 A1 | 6/2012 | Kawanami et al. |
| 2012/0240632 A1 | 9/2012 | Matsumoto |
| 2013/0095260 A1 | 4/2013 | Bovatsek et al. |
| 2013/0112650 A1 | 5/2013 | Karam et al. |
| 2013/0125516 A1 | 5/2013 | Bayne et al. |
| 2013/0183474 A1 | 7/2013 | Bovatsek et al. |
| 2013/0223922 A1 | 8/2013 | Koval et al. |
| 2014/0004318 A1 | 1/2014 | Bovatsek et al. |
| 2014/0087099 A1 | 3/2014 | Veersamy et al. |
| 2014/0151742 A1 | 6/2014 | Logunov et al. |
| 2014/0242306 A1 | 8/2014 | Koval et al. |
| 2015/0027168 A1 | 1/2015 | Dabich, II et al. |

FOREIGN PATENT DOCUMENTS

| | | |
|---|---|---|
| JP | 2012104397 A | 5/2012 |
| WO | 1996002473 A1 | 2/1996 |
| WO | 200 030530 A1 | 5/2001 |
| WO | 2008045249 A1 | 4/2008 |
| WO | 2013070791 A1 | 5/2013 |
| WO | 2013130374 A1 | 9/2013 |
| WO | 2014052178 A1 | 4/2014 |
| WO | 2014085427 A1 | 6/2014 |

Wavelength, nm

GLASS SEALING WITH TRANSPARENT MATERIALS HAVING TRANSIENT ABSORPTION PROPERTIES

CROSS-REFERENCE TO RELATED APPLICATIONS

This application is a divisional application of and claims the benefit of priority of co-pending U.S. application Ser. No. 13/841,391 filed on Mar. 15, 2013, which claims the benefit of priority under 35 U.S.C. § 119 of U.S. Provisional Application Ser. No. 61/731,784 filed on Nov. 30, 2012, the contents of which are hereby relied upon and incorporated herein by reference in their entireties.

BACKGROUND

The present disclosure relates generally to hermetic barrier layers, and more particularly to methods and compositions used to seal solid structures using low melting temperature glasses.

Hermetic barrier layers can be used to protect sensitive materials from deleterious exposure to a wide variety of liquids and gases. As used herein, "hermetic" refers to a state of being completely or substantially sealed, especially against the escape or entry of water or air, though protection from exposure to other liquids and gases is contemplated.

Glass-to-glass bonding techniques can be used to sandwich a workpiece between adjacent substrates and generally provide a degree of encapsulation. Conventionally, glass-to-glass substrate bonds such as plate-to-plate sealing techniques are performed with organic glues or inorganic glass frits. Device makers of systems requiring thoroughly hermetic conditions for long-term operation generally prefer inorganic metal, solder, or frit-based sealing materials because organic glues (polymeric or otherwise) form barriers that are generally permeable to water and oxygen at levels many orders of magnitude greater than the inorganic options. On the other hand, while inorganic metal, solder, or frit-based sealants can be used to form impermeable seals, the resulting sealing interface is generally opaque as a result of the metal cation composition, scattering from gas bubble formation, and distributed ceramic-phase constituents.

Frit-based sealants, for instance, include glass materials that have been ground to a particle size ranging typically from about 2 to 150 microns. For frit-sealing applications, the glass frit material is typically mixed with a negative CTE material having a similar particle size, and the resulting mixture is blended into a paste using an organic solvent. Example negative CTE inorganic fillers include cordierite particles (e.g. $Mg_2Al_3[AlSi_5O_{18}]$) or barium silicates. The solvent is used to adjust the viscosity of the mixture.

To join two substrates, a glass frit layer can be applied to sealing surfaces on one or both of the substrates by spin-coating or screen printing. The frit-coated substrate(s) are initially subjected to an organic burn-out step at relatively low temperature (e.g., 250° C. for 30 minutes) to remove the organic vehicle. Two substrates to be joined are then assembled/mated along respective sealing surfaces and the pair is placed in a wafer bonder. A thermo-compressive cycle is executed under well-defined temperature and pressure whereby the glass frit is melted to form a compact glass seal.

Glass frit materials, with the exception of certain lead-containing compositions, typically have a glass transition temperature greater than 450° C. and thus require processing at elevated temperatures to form the barrier layer. Such a high-temperature sealing process may be detrimental to temperature-sensitive workpieces.

Further, the negative CTE inorganic fillers, which are used in order to lower the thermal expansion coefficient mismatch between typical substrates and the glass frit, will be incorporated into the bonding joint and result in a frit-based barrier layer that is neither transparent nor translucent.

Based on the foregoing, it would be desirable to form glass-to-glass seals at low temperatures that are transparent and optionally hermetic.

SUMMARY

Disclosed herein are methods for forming a laser-sealed interface between opposing glass substrates using a low melting temperature glass (low $T_g$) sealing material at the interface. Embodiments of the method involve temporary absorption of laser radiation and the concomitant localized melting of both the glass sealing material and the glass substrates to affect the seal. After the seal is formed and the materials are cooled, the resulting package is transparent.

A method of protecting a workpiece comprises forming a low $T_g$ glass sealing layer over a major surface of a first glass substrate, arranging a workpiece to be protected between the first substrate and a second substrate where the sealing layer is in contact with the second substrate, and locally heating the glass sealing layer and the glass substrates with laser radiation to melt the sealing layer and the glass substrates to form a glass seal between the substrates. Absorption of the laser radiation by the glass substrates is transient and thermally-induced.

The laser radiation can be translated to define a sealing interface that can cooperate with the glass substrates to define a hermetic package for the workpiece. Example workpieces include quantum dots. Example laser radiation includes ultra-violet (UV) radiation.

Additional features and advantages will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention and together with the description serve to explain the principles and operations of the invention.

DETAILED DESCRIPTION

Figure 1:
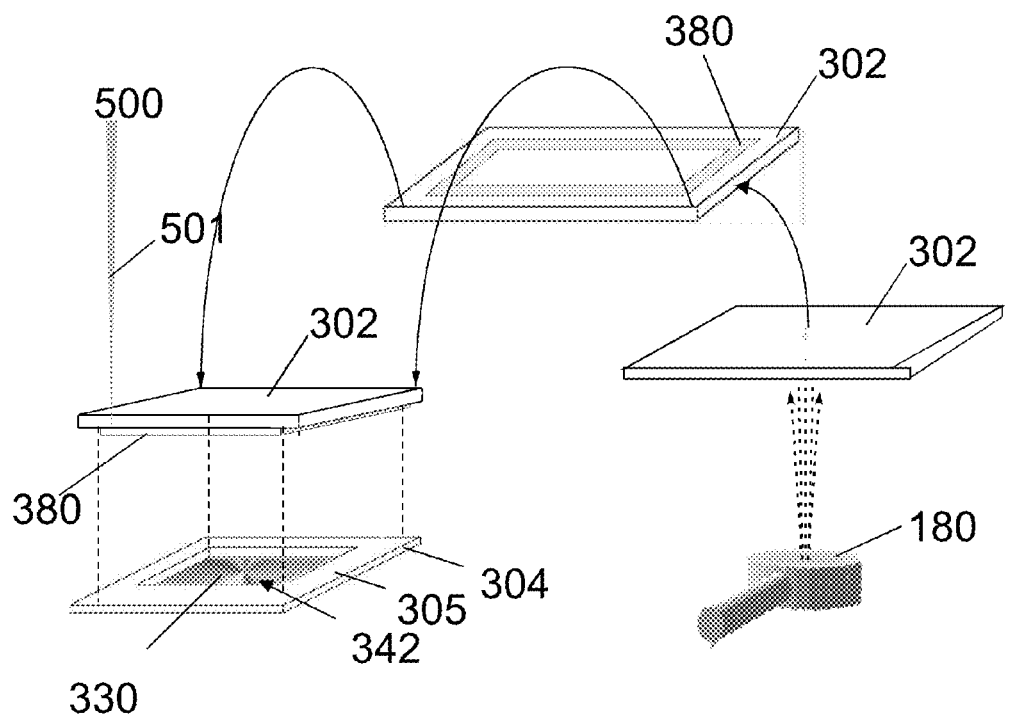
FIG. 1 is a schematic diagram illustrating the formation of a hermetically-sealed device via laser-sealing according to one embodiment.

Although the sealing techniques disclosed herein are described in certain embodiments with respect to manufacturing a hermetically-sealed OLED display, it should be understood that the same or similar sealing techniques can be used to seal two glass plates to one another that can be used in a wide variety of applications and devices. Accordingly, the sealing techniques of the present disclosure should not be construed in a limited manner. For example, thin film sensors and vacuum-insulated glass windows may be fabricated using the present methods.

A sealed structure comprises opposing glass substrates and a low melting temperature glass sealing layer formed at an interface between the substrates. A laser is used to locally heat the sealing material as well as the respective substrates to affect the seal. During sealing, the sealing material melts and re-solidifies to form the seal. In embodiments, material from one or both of the substrates also melts and re-solidifies in a region proximate the melted and re-solidified sealing material. In such embodiments, the substrate material may constitute a portion of the sealed interface, resulting in a glass-to-glass weld.

In embodiments, the glass substrates exhibit transient absorption of the incident laser radiation. Initial absorption by the sealing glass melts the sealing glass material and, due principally to a local increase in temperature of the glass substrate, induces a temporary absorption of the laser radiation by the glass substrate, which may cause localized melting of the substrates. Absorption by the glass substrates decays after the sealing process is complete, resulting in an optically-transparent seal.

Transient absorption as used herein refers generally to any light-material interaction involving additional absorption of light from light-induced defects, to include color center formation. A feature of transient absorption is that additional absorption occurs in the material at excitation wavelengths above and beyond simple linear absorption. Thus, in various embodiments, temporary absorption of laser radiation by a glass substrate can occur by increasing the temperature of the substrate material. Transient absorption may include multi-photon processes.

In contrast to pico-second pulse width, purely non-linear absorption phenomena observed in some glass materials, the methods described herein involve non-linear absorption of the glass substrate materials at relatively long (1-10 ns) laser pulses. Typical power densities for 355 nm lasers, for instance, operating at a repetition rate of about 30 kHz are about 0.5 to 1 MW/cm$^2$.

As used herein, the term "induced absorption" refers to the absolute value of the difference in internal transmission per centimeter of the glass upon exposure to laser irradiation. Of particular interest is the induced absorption at about 355 nm, which means the induced absorption at 355 nm upon exposure to an excimer laser operating at about 355 nm for 10 billion pulses at about 70 μJ/(pulse·cm$^2$).

Thus, in embodiments, laser radiation incident on a glass substrate/sealing glass/glass substrate interface can initially be absorbed by the sealing glass material inducing melt formation and, in turn, cause a local increase in temperature which temporarily alters the absorption characteristics of the adjacent glass substrate material. A temperature increase in glass substrate material can occur through heat conduction from the sealing glass and via a temperature-induced absorption enhancement from the illumination. Transient absorption of the laser radiation by the glass substrate can cause local melting of the glass substrate material in addition to local melting of the sealing glass, forming a glass-to-glass seal. Eagle 2000® glass, for example, softens at a temperature of about 830° C. When the laser radiation is removed and the sealed area cooled, the absorption characteristics of the glass substrate material return to their pre-processed state, i.e., optically transparent.

The integrity of the seal and its strength is maintained by slow cooling (self-annealing) of the substrate glass and the attendant color center relaxation, as well as by the relative thinness of the low melting temperature sealing glass, which minimizes the impact of any CTE mismatch. Further minimizing the CTE mismatch in the sealed region is the inter-diffusion of the mismatched materials within the weld zone, which effectively dilutes the expansion mismatch.

The present method can be used to form a hermetically-sealed package. In further embodiments, the method can be used to form spot seals for non-hermetic glass packages.

A method of forming an encapsulated workpiece according to one embodiment is illustrated schematically in FIG. 1. In initial step, a patterned glass layer 380 comprising a low melting temperature (i.e., low $T_g$) glass is formed along a sealing surface of a first planar glass substrate 302. The glass layer 380 may be deposited via physical vapor deposition, for example, by sputtering from a sputtering target 180. In one embodiment, the glass layer may be formed along a peripheral sealing surface adapted to engage with a sealing surface of a second glass substrate 304. In the illustrated embodiment, the first and second substrates, when brought into a mating configuration, cooperate with the glass layer to define an interior volume 342 that contains a workpiece 330 to be protected. In the illustrated example, which shows an exploded image of the assembly, the second substrate comprises a recessed portion within which a workpiece 330 is situated.

A focused laser beam 501 from laser 500 can be used to locally melt the low melting temperature glass and adjacent glass substrate material form a sealed interface. In one approach, the laser can be focused through the first substrate 302 and then translated (scanned) across the sealing surface to locally heat the glass sealing material. In order to affect local melting of the glass layer, the glass layer is preferably absorbing at the laser processing wavelength. The glass substrates can be initially transparent (e.g., at least 50%, 70%, 80% or 90% transparent) at the laser processing wavelength.

In an alternate embodiment, in lieu of forming a patterned glass layer, a blanket layer of sealing (low melting temperature) glass can be formed over substantially all of a surface of a first substrate. An assembled structure comprising the first substrate/sealing glass layer/second substrate can be assembled as above, and a laser can be used to locally-define the sealing interface between the two substrates.

Laser 500 can have any suitable output to affect sealing. An example laser is a UV laser such as a 355 nm laser, which lies in the range of transparency for common display glasses. A suitable laser power can range from about 5 W to about 6.15 W.

The width of the sealed region, which can be proportional to the laser spot size, can be about 0.1 to 2 mm, e.g., 0.1, 0.2, 0.5, 1, 1.5 or 2 mm. A translation rate of the laser (i.e., sealing rate) can range from about 1 mm/sec to 100 mm/sec, such as 1, 2, 5, 10, 20, 50 or 100 mm/sec. The laser spot size (diameter) can be about 0.5 to 1 mm.

Suitable glass substrates exhibit significant induced absorption during sealing. In embodiments, first substrate 302 is a transparent glass plate like the ones manufactured and marketed by Corning Incorporated under the brand names of Code 1737 glass or Eagle 2000® glass. Alternatively, first substrate 302 can be any transparent glass plate such as, for example, the ones manufactured and marketed by Asahi Glass Co. (e.g., AN100 glass), Nippon Electric Glass Co., (e.g., OA-10 glass or OA-21 glass), or Samsung Corning Precision Glass Co. Second substrate 304 may be the same glass material as the first glass substrate, or second substrate 304 may be a non-transparent substrate. The glass substrates can have a coefficient of thermal expansion of less than about $150 \times 10^{-7}/°C$, e.g., less than $50 \times 10^{-7}$, $20 \times 10^{-7}$ or $10 \times 10^{-7}/°C$.

Figure 2:
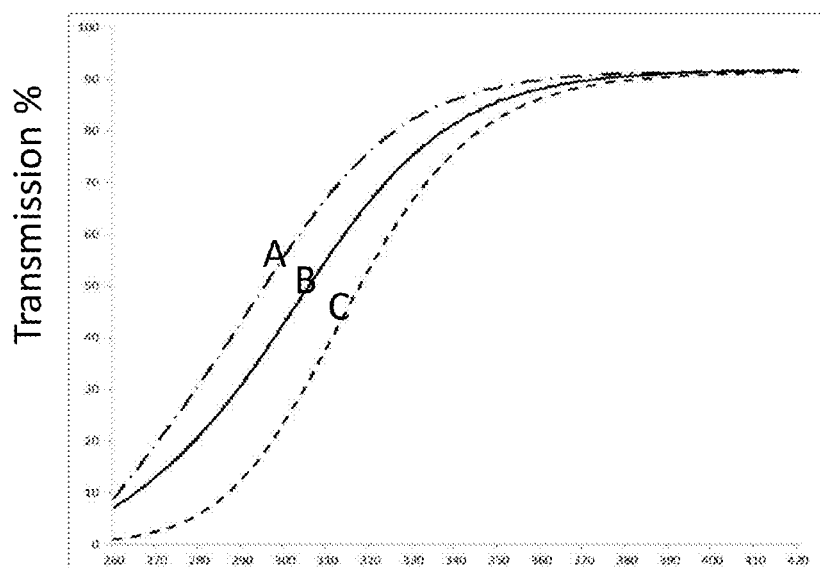
FIG. 2 is a plot of transmission versus wavelength for different display glass substrates.

A plot of transmission versus wavelength for various display glass substrates is shown in FIG. 2. Glass C is a commercially-available, alkali-free, LCD glass that is manufactured using the float process. Glass A is a commercially-available aluminosilicate display glass. Glass B is a borosilicate LCD glass marketed by Corning, Incorporated that contains no added arsenic, antimony, barium or halides. At 355 nm, each of the display glass substrates demonstrates a transparency of between about 80 and 90%.

Figure 3:
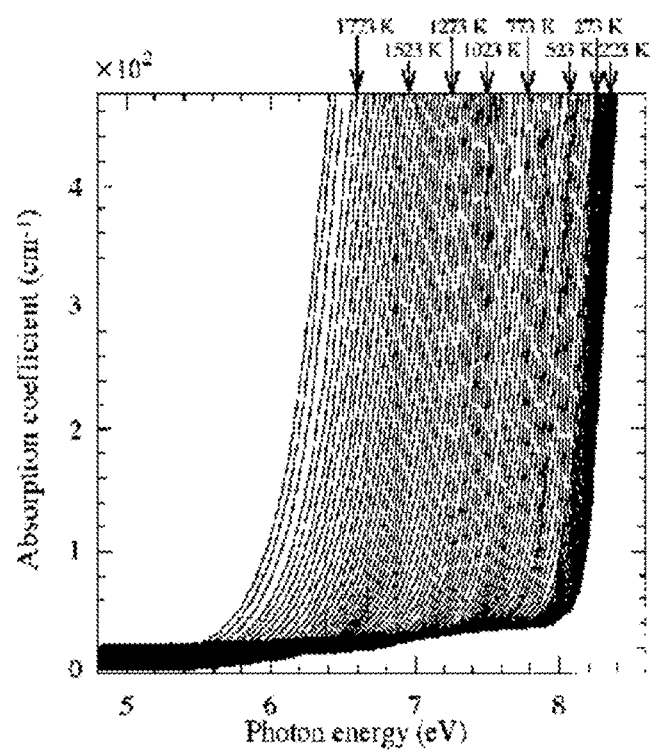
FIG. 3 is a plot showing the temperature dependence of UV absorption in silica glass.

The temperature dependence of the UV absorption edge for silica glass is illustrated in FIG. 3. The absorption edge, which is about 8 eV at 273K, decreases to less than 6.5 eV at 1773K. Thus, as discussed above, such a material can exhibit a temperature-induced, transient absorption.

Figure 4:
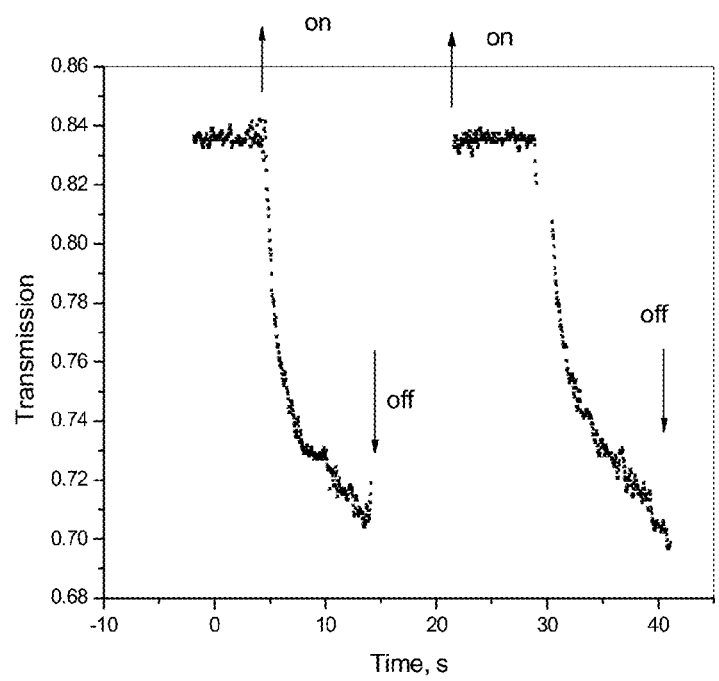
FIG. 4 is a plot of transmission versus time showing induced absorption and recovery for a low $T_g$ glass-coated borosilicate display glass.

Shown in FIG. 4 is the dynamic change of transmission at 355 nm for an Eagle 2000® glass substrate having a 1 micron thick layer of low melting temperature glass formed over a major surface of the substrate. FIG. 4 shows an initial decrease in transmission (increase in absorption) between 0 and 15 seconds, followed by a rapid recovery of the induced absorption when the UV laser is switched off. As seen with reference to FIG. 4, the transient absorption is reversible and repeatable, which enables the formation of a transparent seal. Absorption of laser radiation by the glass substrate can increase with laser exposure (and increasing temperature) from 2-10% initially to 40% or more.

In embodiments, absorption at room temperature of a laser processing wavelength by the glass substrates is less than 15%. However, absorption at elevated temperatures (e.g., greater than 400° C.) of a laser processing wavelength by the glass substrates is greater than 15%. In embodiments, absorption by the glass substrate material increases, for example, to values of 20, 30, 40, 50, 60% or more as the temperature of the glass substrate increases. During sealing, the glass substrate temperature proximate to the sealing interface can increase to at least 400, 500, 600, 700 or 800° C.

Figure 5:
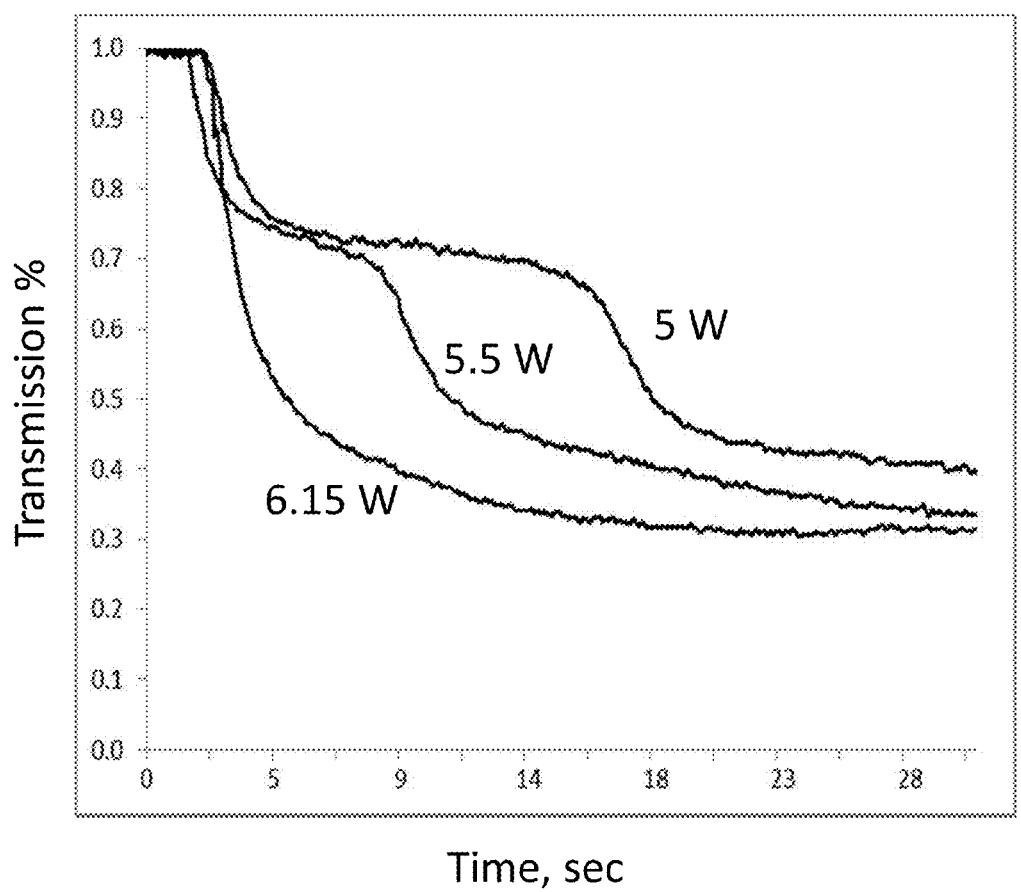
FIG. 5 is a plot of transmission versus time showing the effect of power on transmission through a low $T_g$ glass-coated borosilicate display glass.

FIG. 5 shows the effect of laser power on transmission for a single-layer (~0.5 μm) of low $T_g$ sealing glass formed on a display glass substrate. At low power, an initial decrease in transmission can be attributed to a change in the absorption of the low $T_g$ sealing glass material as it melts. Absorption and melting of the low $T_g$ sealing glass are observed in the first plateau region and heat conduction to the display glass substrate can induce absorption by the glass substrate at longer processing times as its temperature rises concomitantly toward its softening temperature. The additional absorption by the substrate can be affected by the laser power. In FIG. 5, absorption by the low $T_g$ sealing glass can be seen at about 3 seconds and the induced absorption by the glass substrate can be seen at about 17 seconds for 5 W incident laser power. Absorption by the glass substrate can be initiated at shorter process times by increasing the incident laser power. At 5.5 W, for example, the temperature-induced absorption by the glass substrate can be seen at about 9 seconds. A 6.15 W, the respective absorption phenomena occur at about the same time.

Figure 6:
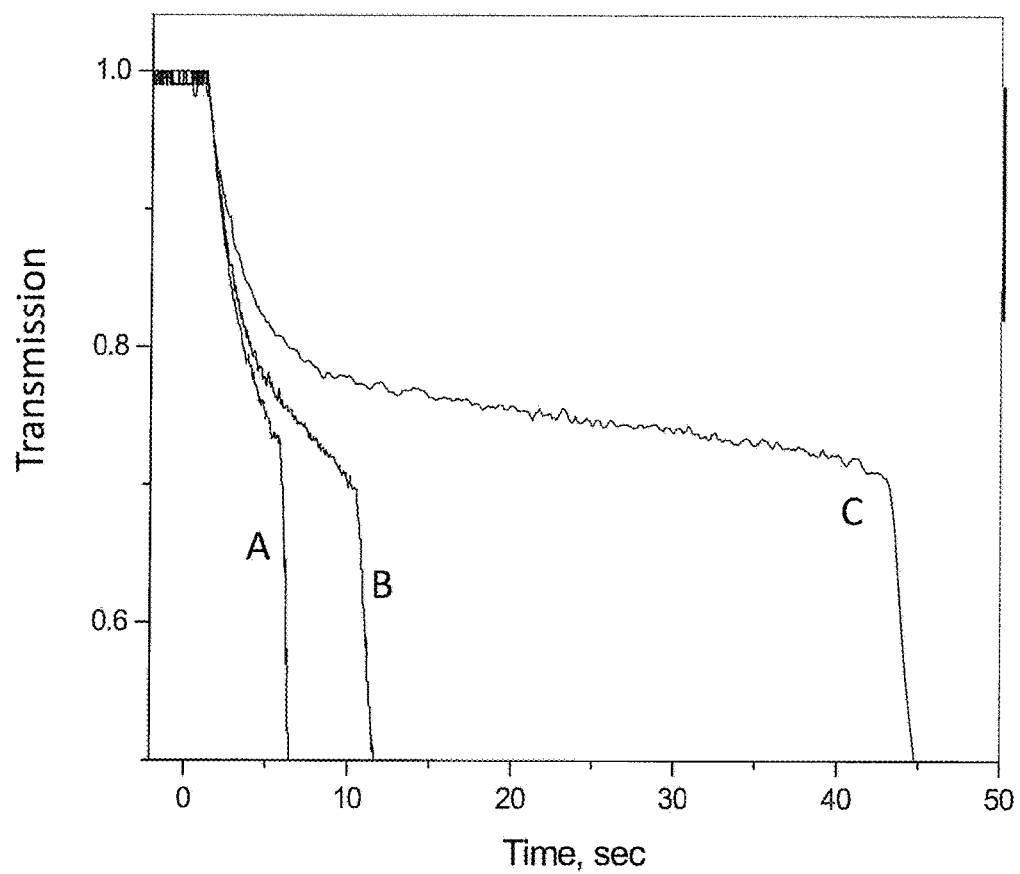
FIG. 6 is a plot of transmission versus time for different display glasses.

FIG. 6 is a plot of transmission versus time for three different display glass substrates showing the variability of the laser-induced melting on substrate composition. In FIG. 6, curve A corresponds to an alkali-free borosilicate LCD glass, which exhibits softening at about 6 seconds. Curves B and C correspond to borosilicate LCD glasses. The Curve B glass exhibits softening at about 11 seconds, while the Curve C, which is essentially free of arsenic, antimony and halides, exhibits softening at about 44 seconds. The major compositional differences between the Curve B glass and the Curve C glass as determined by inductively coupled plasma mass spectroscopy (ICP-MS) are summarized in the Table 1.

TABLE 1

Elemental impurity content in example display glasses

| Impurity | Curve B glass (ppm) | Curve C glass(ppm) |
|---|---|---|
| As | 12 | <1 |
| Fe | 140 | 110 |
| Ga | 14 | 9 |
| K | 92 | 23 |
| Mn | 5 | 13 |
| Na | 280 | 160 |
| P | <10 | 26 |
| Sb | 6 | 2 |
| Ti | 43 | 76 |
| Zn | 5 | 5 |

In various embodiments of the present disclosure, the glass sealing materials and resulting layers are transparent and/or translucent, thin, impermeable, "green," and configured to form hermetic seals at low temperatures and with sufficient seal strength to accommodate large differences in CTE between the sealing material and the adjacent glass substrates. In embodiments, the sealing layers are free of fillers. In further embodiments, the sealing layers are free of binders. In still further embodiments, the sealing layers are free of fillers and binders. Further, organic additives are not used to form the hermetic seal. The low melting temperature glass materials used to form the sealing layer(s) are not frit-based or powders formed from ground glasses. In embodiments, the sealing layer material is a low $T_g$ glass that has a substantial optical absorption cross-section at a predetermined wavelength which matches or substantially matches the operating wavelength of a laser used in the sealing process.

In embodiments, absorption at room temperature of a laser processing wavelength by the low $T_g$ glass layer is at least 15%.

In general, suitable sealant materials include low $T_g$ glasses and suitably reactive oxides of copper or tin. The glass sealing material can be formed from low $T_g$ materials such as phosphate glasses, borate glasses, tellurite glasses and chalcogenide glasses. As defined herein, a low $T_g$ glass material has a glass transition temperature of less than 400° C., e.g., less than 350, 300, 250 or 200° C.

Example borate and phosphate glasses include tin phosphates, tin fluorophosphates and tin fluoroborates. Sputtering targets can include such glass materials or, alternatively, precursors thereof. Example copper and tin oxides are CuO and SnO, which can be formed from sputtering targets comprising pressed powders of these materials.

Optionally, the glass sealing compositions can include one or more dopants, including but not limited to tungsten, cerium and niobium. Such dopants, if included, can affect, for example, the optical properties of the glass layer, and can be used to control the absorption by the glass layer of laser radiation. For instance, doping with ceria can increase the absorption by a low $T_g$ glass barrier at laser processing wavelengths.

Example tin fluorophosphate glass compositions can be expressed in terms of the respective compositions of SnO, $SnF_2$ and $P_2O_5$ in a corresponding ternary phase diagram. Suitable tin fluorophosphates glasses include 20-100 mol % SnO, 0-50 mol % $SnF_2$ and 0-30 mol % $P_2O_5$. These tin fluorophosphates glass compositions can optionally include 0-10 mol % $WO_3$, 0-10 mol % $CeO_2$ and/or 0-5 mol % $Nb_2O_5$.

For example, a composition of a doped tin fluorophosphate starting material suitable for forming a glass sealing layer comprises 35 to 50 mole percent SnO, 30 to 40 mole percent $SnF_2$, 15 to 25 mole percent $P_2O_5$, and 1.5 to 3 mole percent of a dopant oxide such as $WO_3$, $CeO_2$ and/or $Nb_2O_5$.

A tin fluorophosphate glass composition according to one particular embodiment is a niobium-doped tin oxide/tin fluorophosphate/phosphorus pentoxide glass comprising about 38.7 mol % SnO, 39.6 mol % $SnF_2$, 19.9 mol % $P_2O_5$ and 1.8 mol % $Nb_2O_5$. Sputtering targets that can be used to form such a glass layer may include, expressed in terms of atomic mole percent, 23.04% Sn, 15.36% F, 12.16% P, 48.38% O and 1.06% Nb.

A tin phosphate glass composition according to an alternate embodiment comprises about 27% Sn, 13% P and 60% O, which can be derived from a sputtering target comprising, in atomic mole percent, about 27% Sn, 13% P and 60% O. As will be appreciated, the various glass compositions disclosed herein may refer to the composition of the deposited layer or to the composition of the source sputtering target.

As with the tin fluorophosphates glass compositions, example tin fluoroborate glass compositions can be expressed in terms of the respective ternary phase diagram compositions of SnO, $SnF_2$ and $B_2O_3$. Suitable tin fluoroborate glass compositions include 20-100 mol % SnO, 0-50 mol % $SnF_2$ and 0-30 mol % $B_2O_3$. These tin fluoroborate glass compositions can optionally include 0-10 mol % $WO_3$, 0-10 mol % $CeO_2$ and/or 0-5 mol % $Nb_2O_5$.

Additional aspects of suitable low $T_g$ glass compositions and methods used to form glass sealing layers from these materials are disclosed in commonly-assigned U.S. Pat. No. 5,089,446 and U.S. patent application Ser. Nos. 11/207,691, 11/544,262, 11/820,855, 12/072,784, 12/362,063, 12/763,541 and 12/879,578, the entire contents of which are incorporated by reference herein.

A total thickness of a glass sealing layer can range from about 100 nm to 10 microns. In various embodiments, a thickness of the layer can be less than 10 microns, e.g., less than 10, 5, 2, 1, 0.5 or 0.2 microns. Example glass sealing layer thicknesses include 0.1, 0.2, 0.5, 1, 2, 5 or 10 microns.

According to embodiments, the choice of the sealing layer material and the processing conditions for forming a sealing layer over a glass substrate are sufficiently flexible that the substrate is not adversely affected by formation of the glass layer.

Low melting temperature glasses can be used to seal or bond different types of substrates. Sealable and/or bondable substrates include glasses, glass-glass laminates, glass-polymer laminates, glass-ceramics or ceramics, including gallium nitride, quartz, silica, calcium fluoride, magnesium fluoride or sapphire substrates. In embodiments, one substrate can be a phosphor-containing glass plate, which can be used, for example, in the assembly of a light emitting device.

Glass substrates can have any suitable dimensions. Substrates can have areal (length and width) dimensions that independently range from 1 cm to 5 m (e.g., 0.1, 1, 2, 3, 4 or 5 m) and a thickness dimension that can range from about 0.5 mm to 2 mm (e.g., 0.5, 0.6, 0.7, 0.8, 0.9, 1.0, 1.2, 1.5 or 2 mm). In further embodiments, a substrate thickness can range from about 0.05 mm to 0.5 mm (e.g., 0.05, 0.1, 0.2, 0.3, 0.4 or 0.5 mm). In still further embodiments, a glass substrate thickness can range from about 2 mm to 10 mm (e.g., 2, 3, 4, 5, 6, 7, 8, 9 or 10 mm).

A phosphor-containing glass plate, for example, comprising one or more of a metal sulfide, metal silicate, metal aluminate or other suitable phosphor, can be used as a wavelength-conversion plate in white LED lamps. White LED lamps typically include a blue LED chip that is formed using a group III nitride-based compound semiconductor for emitting blue light. White LED lamps can be used in lighting systems, or as backlights for liquid crystal displays, for example. The low melting temperature glasses and associate sealing method disclosed herein can be used to seal or encapsulate the LED chip.

Hermetic encapsulation of a workpiece using the disclosed materials and methods can facilitate long-lived operation of devices otherwise sensitive to degradation by oxygen and/or moisture attack. Example workpieces, devices or applications include flexible, rigid or semi-rigid organic LEDs, OLED lighting, OLED televisions, photovoltaics, MEMs displays, electrochromic windows, fluorophores, alkali metal electrodes, transparent conducting oxides, quantum dots, etc.

As used herein, a hermetic layer is a layer which, for practical purposes, is considered substantially airtight and substantially impervious to moisture and/or oxygen. By way of example, the hermetic seal can be configured to limit the transpiration (diffusion) of oxygen to less than about $10^{-2}$ $cm^3/m^2/day$ (e.g., less than about $10^{-3}$ $cm^3/m^2/day$), and limit the transpiration (diffusion) of water to about $10^{-2}$ $g/m^2/day$ (e.g., less than about $10^{-3}$, $10^{-4}$, $10^{-5}$ or $10^{-6}$ $g/m^2/day$). In embodiments, the hermetic seal substantially inhibits air and water from contacting a protected workpiece.

Figure 7:
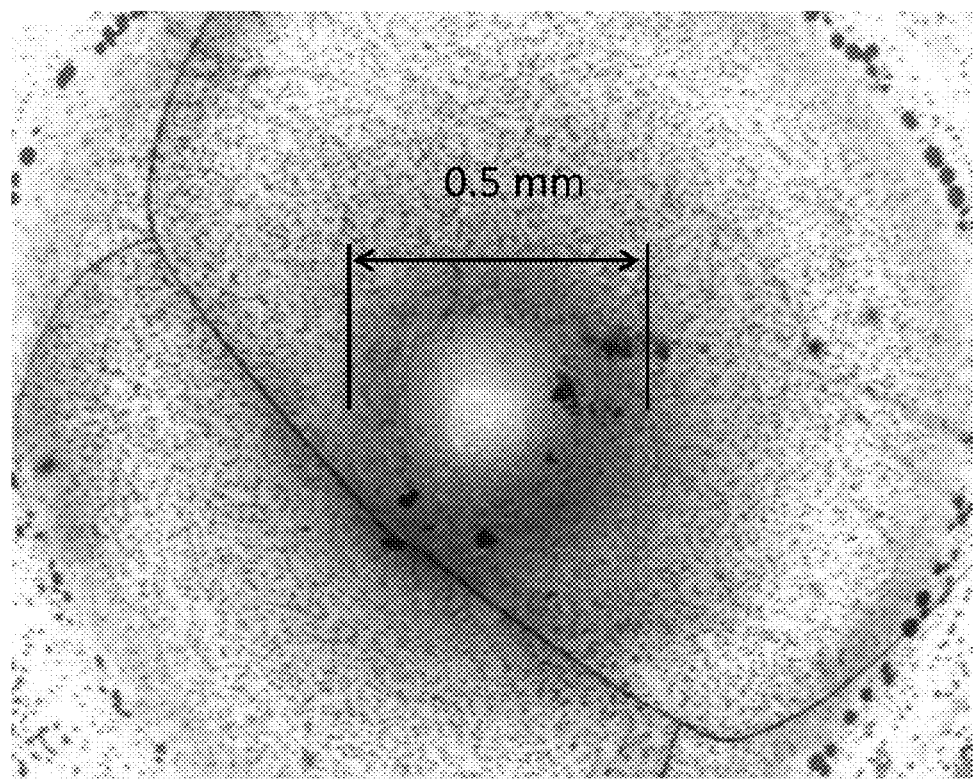
FIG. 7 is a photograph of a spot seal formed via laser-sealing.

FIG. 7 is a plan-view optical micrograph showing a spot seal between two display glass substrates. The diameter of the sealed region is about 0.5 mm.

Figure 8A:
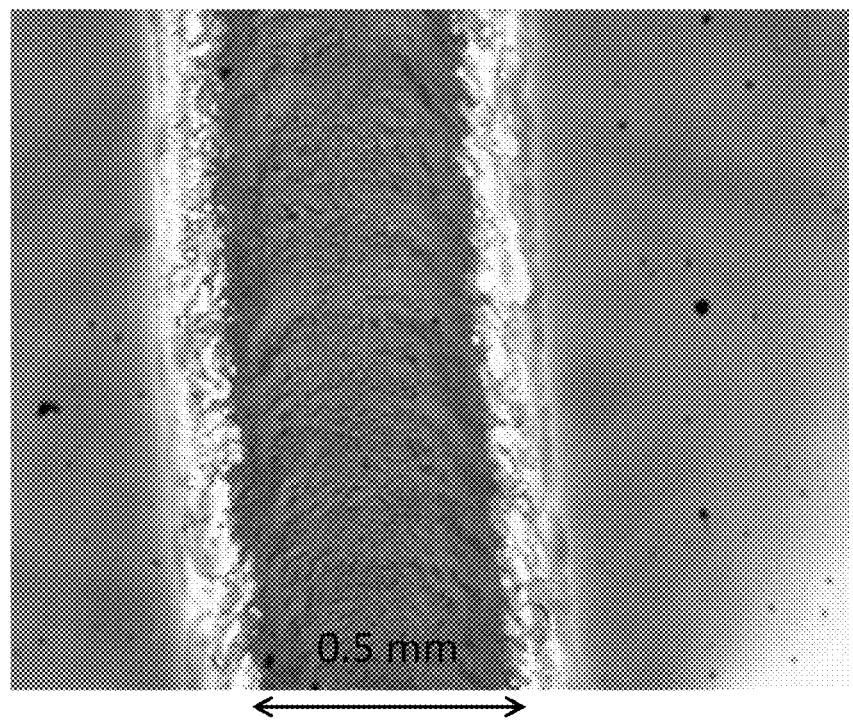
FIGS. 8A and 8B are plan-view photographs of a portion of a glass weld formed via laser-sealing.
Figure 8B:
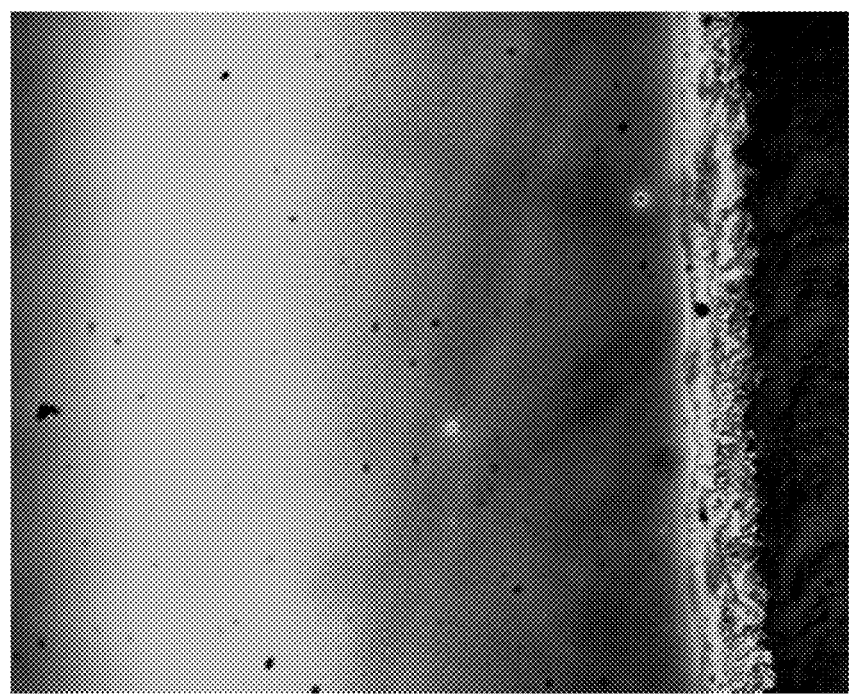

FIGS. 8A and 8B are plan-view optical micrographs showing a portion of sealing interface between two display glass substrates. FIG. 8A shows a sealing interface having a width of about 0.5 mm. FIG. 8B is a plan-view of an un-sealed region adjacent to the sealing interface.

Figure 9A:
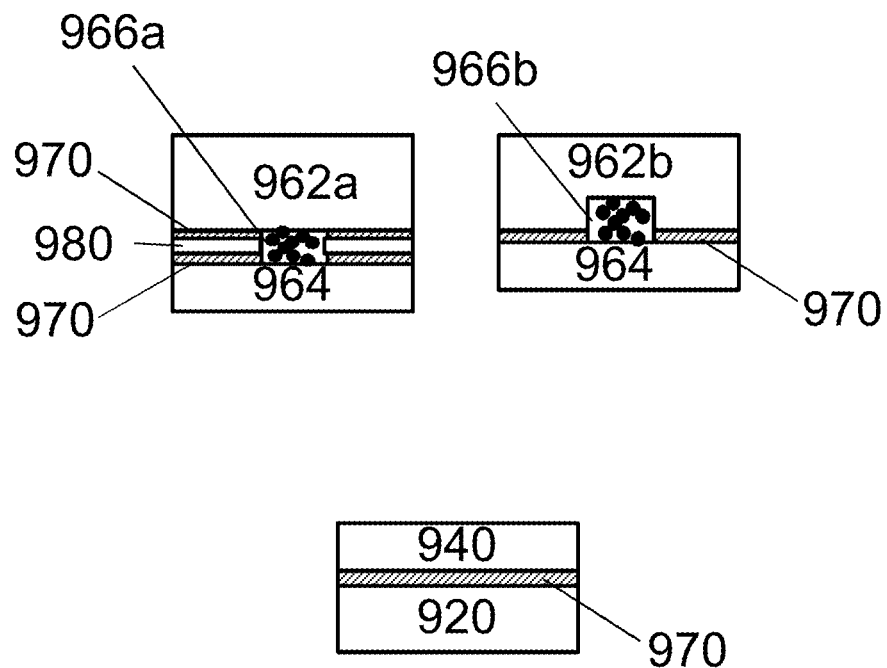
FIGS. 9A and 9B are schematic diagrams of examples of an LED assembly sealed using low melting temperature glass layers.
Figure 9B:
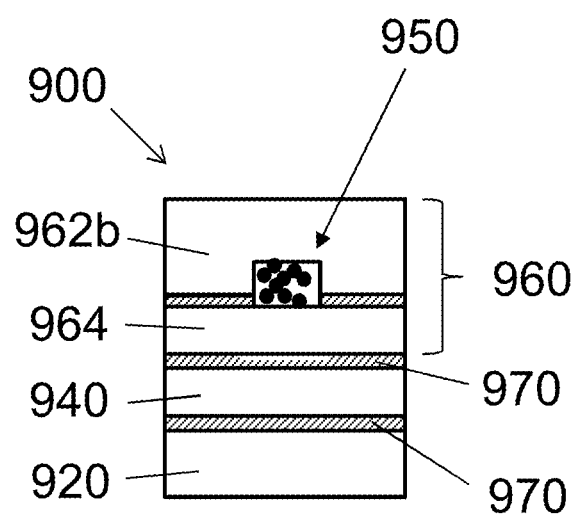

A simplified schematic showing a portion of an LED assembly is depicted in FIG. 9a and FIG. 9b. Components of the assembly according to various embodiments are shown in FIG. 9a, and an example of an assembled architecture is shown in FIG. 9b. The LED assembly 900 includes an emitter 920, a wavelength-conversion plate 940, and a quantum dot sub-assembly 960. As explained in further detail below, glass layers can be used to bond and/or seal various components of the LED assembly. In the illustrated embodiment, the wavelength-conversion plate 940 is disposed directly over the emitter 920, and the quantum dot sub-assembly 960 is disposed directly over the wavelength-conversion plate 940.

One component of the LED assembly 900 is a quantum dot sub-assembly 960, which in various embodiments includes a plurality of quantum dots 950 disposed between an upper plate 962a, 962b and a lower plate 964. The quantum dots in one embodiment are located within a cavity 966a that is defined by upper plate 962a, lower plate 964 and glass-coated gasket 980. In an alternate embodiment, the quantum dots are located within a cavity 966b that is formed in the upper plate 962b, and which is defined by upper plate 962b and lower plate 964. In the first embodiment, the upper plate 962a and the lower plate 964 can be sealed along respective contact surfaces by a glass-coated gasket 980 having respective glass layers 970. In the second embodiment, the upper plate 962b and the lower plate 964 can be directly sealed along respective contact surfaces by a glass layer 970. In non-illustrated embodiments, quantum dots may be encapsulated by a low-melting temperature glass within the cavities 966a, 966b.

A thermo-compressive stress may be applied to affect sealing between the upper and lower plates, or the interface(s) may be laser sealed by focusing a suitable laser on or near the glass layer(s) through either of the upper or lower plates.

A further component of the LED assembly 900 is an emitter 920 with a wavelength-conversion plate 940 formed over an output of the emitter. The emitter 920 can include a semiconductor material such as a gallium nitride wafer, and the wavelength-conversion plate 940 can comprise a glass or ceramic having particles of a phosphor embedded or infiltrated therein. In embodiments, a low melting temperature glass can be used to directly bond a sealing surface of the wavelength-conversion plate to a sealing surface of the emitter.

Figure 10A:
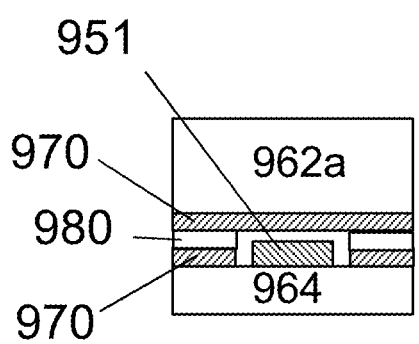
FIGS. 10A through 10C are further examples of an LED assembly comprising a low melting temperature glass seal.

Alternate embodiments, which include example photovoltaic (PV) device or organic light emitting diode (OLED) device architectures, are depicted in FIG. 10. As shown in FIG. 10a, active component 951 is located within a cavity that is defined by upper plate 962a, lower plate 964 and glass-coated gasket 980. Glass layers 970 can be formed between opposing sealing surfaces in the upper plate and the glass-coated gasket, and in the glass-coated gasket and the lower plate, respectively. The geometry illustrated in FIG. 10a is similar to the geometry of FIG. 9a, except the upper glass layer in FIG. 10a extends beyond the contact surface with gasket 980. Such an approach may be beneficial insomuch as a patterning step of the upper glass layer may be omitted. In the example of an OLED display, active component 951 may include an organic emitter stack that is sandwiched between an anode and a cathode. The cathode, for example can be a reflective electrode or a transparent electrode.

Figure 10B:
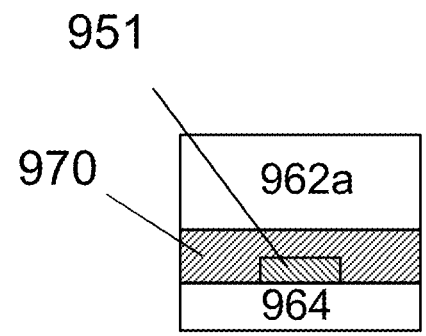
Figure 10C:
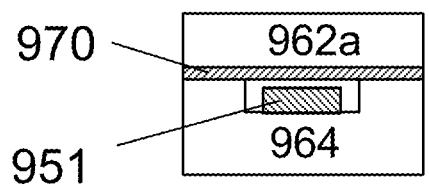

Illustrated in FIG. 10b is a geometry where active component 951 is encapsulated between upper plate 962a and lower plate 964 using a conformal glass layer 970. Illustrated in FIG. 10c is a structure where active component 951 is located within a cavity that is defined by upper plate 962a and lower plate 964. The geometry illustrated in FIG. 10c is similar to the geometry of FIG. 9b, except the glass layer in FIG. 10c extends beyond the contact surface between the upper and lower glass plates.

To form a seal or bond between respective sealing surfaces, initially a glass layer may be formed on one or both of the surfaces. In one embodiment, a glass layer is formed over each of the surfaces to be bonded, and after the surfaces are brought together, a focused laser is used to melt the glass layers and the adjacent sealing surface material to create the seal. In one further embodiment, a glass layer is formed over only one of the surfaces to be bonded, and after the glass-coated surface and non-glass-coated surface are brought together, a focused laser is used to locally melt the glass layer and the respective surfaces to be bonded to create the seal.

A method of bonding two substrates comprises forming a first glass layer on a sealing surface of a first substrate, forming a second glass layer on a sealing surface of a second substrate, placing at least a portion of the first glass layer in physical contact with at least a portion of the second glass layer, and heating the glass layers to locally melt the glass layers and the sealing surfaces to form a glass-to-glass weld between the first and second substrates.

Figure 11:
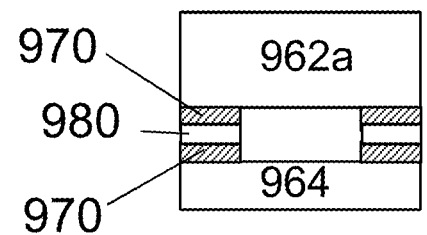
FIG. 11 is an example vacuum-insulated glass window comprising low melting temperature glass seals.

In alternate embodiments, the sealing approaches disclosed herein can be used to form vacuum-insulated glass (VIG) windows where the previously-discussed active components (such as the emitter, collector or quantum dot architecture) are omitted from the structure, and a low melting temperature glass layer is used to seal respective bonding interfaces between opposing glass panes in a multi-pane window. A simplified VIG window architecture is shown in FIG. 11, where opposing glass panes 962a, 964 are separated by a glass-coated gasket 980 that is positioned along respective peripheral sealing surfaces.

In each of the sealing architectures disclosed herein, sealing using a low melting temperature glass layer may be accomplished by the local heating, melting and then cooling of both the glass layer and the glass substrate material located proximate to the sealing interface.

As used herein, the singular forms "a," "an" and "the" include plural referents unless the context clearly dictates otherwise. Thus, for example, reference to a "glass substrate" includes examples having two or more such "glass substrates" unless the context clearly indicates otherwise.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It is also noted that recitations herein refer to a component being "configured" or "adapted to" function in a particular way. In this respect, such a component is "configured" or "adapted to" embody a particular property, or function in a particular manner, where such recitations are structural recitations as opposed to recitations of intended use. More specifically, the references herein to the manner in which a component is "configured" or "adapted to" denotes an existing physical condition of the component and, as such, is to be taken as a definite recitation of the structural characteristics of the component.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

We claim:

1. A sealed device comprising:
   a non-frit, low $T_g$ glass sealing layer formed over a surface of a first substrate; and
   a device protected between the first substrate and a second substrate,
   wherein the glass sealing layer is in contact with the second substrate, and
   wherein the device is hermetically sealed between the first and second substrates as a function of a composition of impurities in the first or second substrates and as a function of a composition of the glass sealing layer through a local heating of the glass sealing layer with laser radiation having a predetermined wavelength.

2. The device of claim 1, wherein the glass sealing layer comprises:
   20-100 mol % SnO;
   0-50 mol % $SnF_2$; and
   0-30 mol % $P_2O_5$ or $B_2O_3$.

3. The device of claim 1, wherein the impurities in the first or second substrates are selected from the group consisting of As, Fe, Ga, K, Mn, Na, P, Sb, Ti, Zn, Sn and combinations thereof.

4. The device of claim 1, wherein the first and second substrates have different lateral dimensions, different CTEs, different thicknesses, or combinations thereof.

5. The device of claim 1, wherein one of the first and second substrates is a glass substrate.

6. The device of claim 5, wherein the other of the first and second substrates is a ceramic substrate or a metal substrate.

7. The device of claim 1, wherein at least one of the first and second substrates is a glass substrate having (a) an absorption of laser radiation having a predetermined wavelength that is less than 15% at room temperature and (b) an induced transient absorption of the laser radiation that is greater than 15% at a sealing temperature greater than 400° C.

8. The device of claim 7, wherein the predetermined wavelength is chosen from UV wavelengths.

9. The device of claim 1, wherein a thickness of the glass sealing layer ranges from about 100 nm to 10 microns.

10. The device of claim 1, wherein the glass sealing layer is optically transparent.

11. The device of claim 1, wherein the glass sealing layer is free of fillers.

12. The device of claim 1, wherein the device is selected from the group consisting of a light emitting diode, an organic light emitting diode, a quantum dot, and combinations thereof.

13. A sealed device comprising:
    a glass film formed over a surface of a first substrate; and
    a device protected between the first substrate and a second substrate,
    wherein the glass film is in contact with the second substrate,
    wherein the device is hermetically sealed between the first and second substrates, and
    wherein at least one of the first and second substrates is a glass substrate having (a) an absorption of laser radiation having a predetermined wavelength that is less than 15% at room temperature and (b) an induced transient absorption of the laser radiation that is greater than 15% at a sealing temperature greater than 400° C.

14. The device of claim 13, wherein the glass film comprises a non-frit, low $T_g$ glass.

15. The device of claim 13, wherein the glass film comprises:
    20-100 mol % SnO;
    0-50 mol % $SnF_2$; and
    0-30 mol % $P_2O_5$ or $B_2O_3$.

16. The device of claim 13, wherein the glass film is optically transparent.

17. The device of claim 13, wherein the glass film is free of fillers.

18. The device of claim 13, wherein a thickness of the glass film ranges from about 100 nm to 10 microns.

19. The device of claim 13, wherein one of the first and second substrates is a ceramic substrate or a metal substrate.

20. The device of claim 13, wherein the device is selected from the group consisting of a light emitting diode, an organic light emitting diode, a quantum dot, and combinations thereof.

* * * * *

UNITED STATES PATENT AND TRADEMARK OFFICE
CERTIFICATE OF CORRECTION

PATENT NO. : 10,011,525 B2
APPLICATION NO. : 15/584559
DATED : July 3, 2018
INVENTOR(S) : Stephan Lvovich Logunov et al.

Page 1 of 1

It is certified that error appears in the above-identified patent and that said Letters Patent is hereby corrected as shown below:

On the Title Page

On page 2, Column 2, item (56), Foreign Patent Documents, Line 3, delete "200 030530" and insert -- 2001030530 --, therefor.

Signed and Sealed this
Twenty-eighth Day of January, 2020

Andrei Iancu
*Director of the United States Patent and Trademark Office*